(12) United States Patent
Eymery et al.

(10) Patent No.: US 9,117,674 B2
(45) Date of Patent: Aug. 25, 2015

(54) METHOD OF SELECTIVE GROWTH WITHOUT CATALYST ON A SEMICONDUCTING STRUCTURE

(75) Inventors: Joël Eymery, Sassenage (FR); Damien Salomon, Marseilles (FR); Xiaojun Chen, Shanghai (CN); Christophe Durand, Quaix-en-Chartreuse (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/009,305

(22) PCT Filed: Apr. 3, 2012

(86) PCT No.: PCT/EP2012/056091
§ 371 (c)(1),
(2), (4) Date: Dec. 6, 2013

(87) PCT Pub. No.: WO2012/136665
PCT Pub. Date: Oct. 11, 2012

(65) Prior Publication Data
US 2014/0080290 A1    Mar. 20, 2014

(30) Foreign Application Priority Data
Apr. 5, 2011    (FR) ...................................... 11 52926

(51) Int. Cl.
*H01L 21/20*    (2006.01)
*H01L 21/02*    (2006.01)
(Continued)

(52) U.S. Cl.
CPC ........... *H01L 21/02636* (2013.01); *B82Y 10/00* (2013.01); *B82Y 30/00* (2013.01);
(Continued)

(58) Field of Classification Search
CPC .................... H01L 21/02521; H01L 21/02636
USPC .................. 438/483, 507, 438, 478; 977/891; 257/189
See application file for complete search history.

(56) References Cited

U.S. PATENT DOCUMENTS

| 7,834,264 | B2 | 11/2010 | Majumdar et al. |
| 2007/0012956 | A1 | 1/2007 | Gutsche et al. |

(Continued)

FOREIGN PATENT DOCUMENTS

| EP | 1 744 323 | 1/2007 |
| FR | 2 923 651 | 5/2009 |

(Continued)

OTHER PUBLICATIONS

Wildeson, I. et al., "III-nitride nanopyramid light emitting diodes grown by organometallic vapor phase epitaxy", Journal of Applied Physics, American Institute of Physics, vol. 108, No. 4, pp. 044303-1 to 044303-8, (Aug. 18, 2010), XP 012142689.

(Continued)

*Primary Examiner* — Caridad Everhart
(74) *Attorney, Agent, or Firm* — Oblon, McClelland, Maier & Neustadt, L.L.P.

(57) ABSTRACT

A method of selective growth without catalyst on a semi-conducting structure. According to the method, which is applicable in electronics in particular: a semi-conducting structure is formed from first gaseous or molecular flows; at a same time or subsequently, at least one second gaseous or molecular flow is added thereto, to selectively in situ grow a dielectric layer on the structure; and then another semi-conducting structure is grown thereon from third gaseous or molecular flows.

18 Claims, 4 Drawing Sheets

(51) Int. Cl.
*B82Y 10/00* (2011.01)
*B82Y 40/00* (2011.01)
*H01L 29/66* (2006.01)
*H01L 29/775* (2006.01)
*H01L 29/861* (2006.01)
*H01L 33/18* (2010.01)
*H01L 33/24* (2010.01)
*H01L 33/38* (2010.01)
*B82Y 30/00* (2011.01)
*H01L 29/06* (2006.01)

(52) U.S. Cl.
CPC ............ *B82Y 40/00* (2013.01); *H01L 21/0242* (2013.01); *H01L 21/0254* (2013.01); *H01L 21/0259* (2013.01); *H01L 21/0262* (2013.01); *H01L 21/02458* (2013.01); *H01L 21/02521* (2013.01); *H01L 21/02603* (2013.01); *H01L 21/02631* (2013.01); *H01L 21/02639* (2013.01); *H01L 21/02661* (2013.01); *H01L 29/068* (2013.01); *H01L 29/0676* (2013.01); *H01L 29/66469* (2013.01); *H01L 29/775* (2013.01); *H01L 29/861* (2013.01); *H01L 33/18* (2013.01); *H01L 33/24* (2013.01); *H01L 33/38* (2013.01); *H01L 29/0665* (2013.01); *H01L 2924/0002* (2013.01)

(56) References Cited

U.S. PATENT DOCUMENTS

| | | |
|---|---|---|
| 2007/0257264 A1 | 11/2007 | Hersee et al. |
| 2008/0036038 A1 | 2/2008 | Hersee et al. |
| 2008/0149944 A1 | 6/2008 | Samuelson et al. |
| 2009/0152527 A1 | 6/2009 | Lee et al. |
| 2009/0200540 A1 | 8/2009 | Bjoerk et al. |
| 2010/0033561 A1 | 2/2010 | Hersee |
| 2010/0133509 A1 | 6/2010 | Kawashima et al. |
| 2010/0140584 A1 | 6/2010 | Lee et al. |
| 2010/0163840 A1* | 7/2010 | Seifert et al. ............ 257/13 |
| 2010/0237405 A1 | 9/2010 | Shin |
| 2011/0081109 A1* | 4/2011 | Thylen et al. ............ 385/30 |
| 2011/0253982 A1 | 10/2011 | Wang et al. |
| 2012/0225526 A1* | 9/2012 | Hersee et al. ............ 438/172 |

FOREIGN PATENT DOCUMENTS

| | | |
|---|---|---|
| WO | 2008 079078 | 7/2008 |
| WO | 2010 062644 | 6/2010 |

OTHER PUBLICATIONS

Poole, P.J. et al., "Selective epitaxy of semiconductor nanopyramids for nanophotonics", Nanotechnology, IOP Publishing Ltd., vol. 21, No. 29, pp. 1 to 6, (Jul. 23, 2010), XP 020175110.

Thelander, C. et al., "Nanowire-based one-dimensional electronics", materials today, vol. 9, No. 10, pp. 28 to 35, (Oct. 2006).

Hersee, S.D. et al., "GaN nanowire light emitting diodes based on templated and scalable nanowire growth process", Electronics Letters, vol. 45, No. 1, Total pp. 2, (Jan. 1, 2009).

Kitamura, S. et al., "Fabrication of GaN Hexagonal Pyramids on Dot-Patterned GaN / Sapphire Substrates via Selective Metalorganic Vapor Phase Epitaxy", Jpn. J. Appl. Phys., vol. 34, pp. L1184 to L1186, (Sep. 15, 1995).

Chen, X.J. et al., "Homoepitaxial growth of catalyst-free GaN wires on N-polar substrates", Applied Physics Letters, American Institute of Physics, vol. 97, pp. 151909-1 to 151909-3, (2010).

Koester, R. et al., "Self-assembled growth of catalyst-free GaN wires by metal-organic vapour phase epitaxy",Nanotechnology, IOP Publishing, vol. 21, pp. 1 to 9, (2010).

Chelda-Gourmala, O. et al., "Complete HVPE experimental investigations: Cartography of SAG GaN towards quasi-substrates or nanostructures", Journal of Crystal Growth, vol. 312, pp. 1899 to 1907, (2010).

Kishino, K. et al., "Selective-area growth of GaN nanocolumns on titanium-mask-patterned silicon (111) substrates by RF-plasma-assisted molecular-beam epitaxy", Electronics Letters, vol. 44, No. 13, Total pp. 2, (Jun. 19, 2008).

Bergbauer, W. et al. "Continuous-flux MOVPE growth of position-controlled N-face GaN nanorods and embedded InGaN quantum wells", Nanotechnology, IOP Publishing, vol. 21, pp. 1 to 5, (2010).

French Search Report Issued Nov. 29, 2011 in French Patent Application 1152926 Filed Apr. 5, 2011.

International Search Report Issued Jun. 1, 2012 in PCT/EP12/56091 Filed Apr. 3, 2012.

* cited by examiner

METHOD OF SELECTIVE GROWTH WITHOUT CATALYST ON A SEMICONDUCTING STRUCTURE

TECHNICAL FIELD

The present invention relates to a method of selective growth on a semi-conducting structure.

It is applicable in particular:

in electronics, for example for making transistors based on nanowires or, more exactly, wires because the same can have diameters higher than 10 nm, in optoelectronics, to achieve light emission (the invention enables heterostructures to be positioned and this position to be controlled, as well as allows "chemical" passivation of a surface area which can have improved or modified emission properties with respect to a non-passivated area, for example in the case of GaAs, InP or Si wires), to light detection, including in the photovoltaic field, to making chemical detectors/sensors (the invention enables selective functionalization problems to be solved), and in spintronics, for example by having barriers between ferroelectric materials or by positioning heterostructures into a component.

STATE OF PRIOR ART

The growth and positioning of thin layers of dielectric materials, such as nitrides, oxides, carbides for example, are particularly important to make microelectronic and optoelectronic components: such thin layers enable electrical barriers, or insulations, to be created, which for example are capable of electrically insulating parts of these components or to allow to impose an electrical field without charge transport.

For example, such layers are found in the field of semi-conducting nanowires, when the aim is to insulate the gate of a MOS transistor with respect to the channel of this transistor. Concerning this matter, the following document will be for example referred to:

[Thelander06] C. Thelander et al., Nanowire-based one-dimensional electronics, Materialstoday, Vol. 9, N° 10, 2006, pp. 28-35.

They are also found in structures such as light emitting diodes or photodetectors, when it is desired to electrically isolate the active zones, for example to make an electrical contact in order to inject or collect carriers (electrons, holes) in a specific place of these structures, by avoiding short circuits. Concerning this matter, the following documents will be for example referred to:

[Hersee07] Hersee et al., Catalyst-free growth of GaN nanoscale needles and application in InGaN/GaN visible LEDs, US 2007/257264.

[Pederson08] B. Pederson et al., Elevated LED and method of producing such, WO 2008/079078

[Hersee10] Hersee, Solid-state microscope, US2010/033561.

[Hersee09] S. D. Hersee et al., GaN nanowire light emitting diodes based on templated and scalable nanowire growth process, Electronics Letters, Vol. 45, N° 1, 2009.

Besides, these thin layers of dielectric materials can allow to "protect" a part of a structure from a chemical reaction or adsorption, for example when it is desired to control the reaction or the positioning in a place of the structure.

The gas phase growth techniques, such as CVD, PECVD and ALD techniques for example, are well suited to grow layers of dielectric materials, such as $Si_3N_4$, $SiO_2$, $Al_2O_3$ and $HfO_2$ for example. But it is still difficult to grow these compounds selectively and without masking, on a surface, for example on a part of a nanowire, without covering the entire surface.

To solve this problem, it is possible to grow a layer of dielectric material on the entire surface and then to locally remove the layer, by a chemical method, using liquid or gaseous solutions, or a physical method, using ion beams. It is also possible to locally add, by masking, an intermediate layer on which the deposition will be also made but which could be easily removed, in order to obtain a nude area.

This lift-off etching can be made for example chemically, in liquid phase. In the case of semi-conducting nanowires, examples of such a method can be found in the following documents which will be referred to:

[Samuelson08] Samuelson et al., LED with upstanding nanowire structure and method of producing such, US 2008/0149944;

[Shin10] Shin, Semiconductor device with vertical transistor and method for fabricating the same, US 2010/0237405.

Further, to form a structure on a substrate from a compound semi-conductor such as GaN, GaAs or InAs for example, it is known to use a layer of a dielectric such as $Si_3N_4$ or $SiO_2$ for example, to selectively grow the structure. Then, the latter does not grow onto the dielectric layer but in openings which enable it to be grown on the substrate. Concerning this matter, the following documents will be referred to:

[Kitamura95] S. Kitamura et al., Fabrication of GaN hexagonal pyramids on dot-patterned GaN/sapphire substrates via selective metalorganic vapor phase epitaxy, Jpn. J. Appl. Phys., Vol. 34 (1995) pp. L1184-L1186;

[Chen10] X. J. Chen et al, Homoepitaxial growth of catalyst-free GaN wires on N-polar substrates, Appl. Phys. Lett., Vol. 97 (2010) 151909.

With the MOCVD technique, i.e. metal-organic chemical vapour deposition, it has been shown that wires could be spontaneously grown (that is in a self-organized manner) without catalyst, by epitaxy on sapphire substrates having c orientation or on GaN, for example.

Indeed, the catalysts can be troublesome for applications of such wires: they can introduce chemical contaminations therein.

Concerning this wire spontaneous growth technique, the following document will be referred to:

[Koester10] R. Koester et al., Self-assembled growth of catalyst-free GaN wires by metal-organic vapour phase epitaxy, Nanotechnology, Vol. 21 (2010) 015602.

This technique is also used to obtain other structures such as strips, pyramids and tubes for example, or heterostructures including several materials.

As regards wires, radial and longitudinal heterostructures can also be made. Concerning this matter, the following document will be for example referred to:

[Majumdar10] Majumdar et al., Methods of fabricating nanostructures and nanowires and devices fabricated therefrom, U.S. Pat. No. 7,834,264.

To integrate structures into components, for example to integrate vertical or horizontal wires into transistors, light emitters, chemical species (gas or DNA for example) detectors or pH detectors, complex technological steps should generally be added, which require in particular use of other machines (and hence transfers and the contaminations associated with the same), etchings and aligning steps.

Concerning this matter, already mentioned documents [Thelander06] and [Hersee10] will be for example referred to.

DISCLOSURE OF THE INVENTION

The present invention aims at providing a simple solution to the problem of the formation of a dielectric layer, by allowing to control making such a layer which covers all or part of a structure obtained by crystal growth, without adding further lithography/etching steps nor external depositions, that is depositions performed outside the enclosure wherein the layer is formed.

This dielectric layer can be used as a barrier for subsequent growths and thus allow selective growths, that do not occur on this layer.

It is what is sometimes called a "passivation layer" when its chemical properties are more particularly considered, in particular in terms of the reactions that occur at the surface (adsorption of molecules) and creation of bonds which change the surface electrical and optical properties.

It further enable semi-conductor heterostructures to be obtained, which are original, in particular in terms of their electrical contacts, application of electrical fields or making reaction sites, located on well-defined surfaces.

According to various aspects of the method, subject of the invention, to create a dielectric layer on a support:
- an in situ deposition method is used in a gas phase growth enclosure;
- the selectivity of the gas phase growth mechanisms is used to position this layer on the support; this positioning is made with respect to the support faces or along a growth direction of this support; and
- the dielectric properties of the layer are controlled by varying the deposited thicknesses and the growth conditions to define the stoichiometry; these properties can also be changed by subsequent processings, for example annealings under different (neutral or reactive) gases.

It should also be noted that the method, subject of the invention, is a method of selective growth without catalyst.

This method is advantageously applicable to the formation of dielectric layers on nanowire-like structures, for example made of gallium nitride (GaN), in order to cover part of the length of these nanowires.

But it should be noted that the method is not restricted to GaN: it directly extends to other semi-conductors.

With respect to the conventional methods, an essential aspect of the method, subject of the invention, is to allow a layer of dielectric material to be easily and in situ created on a support, during the growth of this support and without further equipment.

Precisely, the object of present invention is to provide a method of selective growth without catalyst on a first semi-conducting structure, wherein the first semi-conducting structure is formed on a substrate, from first gaseous or molecular flows, the method being characterised in that:
- at the same time or subsequently, to the first gaseous or molecular flows, are added at least one second gaseous or molecular flow, capable of selectively in situ growing a dielectric layer on the first semi-conducting structure, and
- on the first semi-conducting structure thus provided with the dielectric layer, a second semi-conducting structure is grown from third gaseous or molecular flows.

According to a preferred embodiment of the method, subject of the invention, the growth conditions of the dielectric layer are selected so as to act on the formation of the first semi-conducting structure.

Preferably, the dielectric layer is selected such that the second semi-conducting structure is formed on the first semi-conducting structure but not on the dielectric layer.

According to a particular embodiment of the method, subject of the invention, the growth of the dielectric layer is suspended, and then resumed.

Preferably, the first gaseous or molecular flows are selected such that the first semi-conducting structure comprises at least one semi-conductor selected from the group comprising semi-conducting nitrides and compound semi-conductors III-V, IV-IV and II-VI.

According to a preferred embodiment of the invention, the second gaseous or molecular flow(s) is (are) selected such that the dielectric layer is made of a material selected from silicon nitride, silica, alumina, hafnium oxide, gallium oxides and gallium oxynitrides.

The first semi-conducting structure can have the shape of a solid selected from prisms with polygonal, rectangular, triangular or trapezoidal bases, pyramids, truncated pyramids and tubes.

Preferably, the first semi-conducting structure, the dielectric layer and the second semi-conducting structure are formed by a technique selected from metal-organic chemical vapour deposition or MOCVD, molecular beam epitaxy or MBE and hydride vapour phase epitaxy or HVPE.

According to a particular embodiment of the invention, the first semi-conducting structure is a wire which vertically extends from the substrate, the dielectric layer is grown such that it covers a lower part of the wire from the substrate, and the second semi-conducting structure is only grown on an upper part of the wire, which is not covered by the dielectric layer.

In this case, an electrically conducting or semi-conducting substrate can be used, the first and second semi-conducting structures can be formed so as to make a diode, and further a first electrically conducting contact can be formed on the substrate and a second electrically conducting contact can be formed on the second semi-conducting structure.

Rather, an electrically conducting or semi-conducting substrate can be used, the first and second semi-conducting structures can be formed so as to make a diode, and further a first electrically conducting contact can be made on the substrate and a layer of electrically conducting transparent material which conformably covers the dielectric layer and the second semi-conducting structure can be formed.

Alternatively, the wire can also be separated from the substrate after the second semi-conducting structure was formed, and then the wire is placed on another substrate such that the wire horizontally extends on the other substrate.

Then, ohmic or electrically conducting contacts can further be formed on the wire, at the dielectric layer and the second semi-conducting structure.

BRIEF DESCRIPTION OF THE DRAWINGS

The present invention will be better understood upon reading the description of exemplary embodiments given hereinafter, by way of purely indicative and in no way limiting purposes, making reference to the appended drawings wherein.

DETAILED DISCLOSURE OF PARTICULAR EMBODIMENTS

Figure 1A:
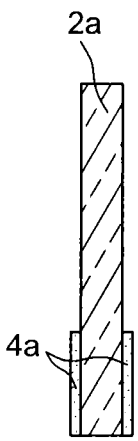
FIGS. 1A to 1H are schematic views of exemplary semi-conducting structures wherein dielectric layers were respectively deposited in accordance with the invention, FIGS. 2A and 2B schematically illustrate an exemplary implementation of the invention.

In accordance with the invention, the growth of a dielectric layer is controlled in situ in an enclosure suitable for this growth.

The layer selectively grows on a semi-conducting structure and can itself be used as a mask for other growths, as will be seen in the following.

Further, the growth of the dielectric layer can be directly integrated to steps for making an electronic component.

In other words, when the same is made in an appropriate device, it is not required to remove the component being made to make the layer: the latter can be formed in the same device.

According to one aspect of the invention:
in an enclosure, the semi-conducting structure wherein a dielectric layer is desired to be formed is made;
at the same time or subsequently, a dielectric precursor is added to the chemical species used to make the semi-conducting structure; the dielectric, when it is formed, can also change the growth mechanisms of this semi-conducting structure; and
the implementation of the method is continued with other chemical species which could possibly use the selectivity towards the dielectric layer just formed.

The following growth conditions enable GaN semi-conducting wires wherein a silicon nitride dielectric layer could be formed to be obtained.

A shower type 3×2" MOCVD rack, marketed by AIXTRON is used, with the precursors trimethylgallium (TMG) at 0° C. and ammonia ($NH_3$) for Ga and N feeds. As described in detail in Document [Koester10], a molar flow ratio in the range of 10-20 allows to promote growth of the wires at about 1000° C. The molar flows are about 60 sccm (standard cubic centimeters per minute) in TMG and 50 sccm in $NH_3$ and a pressure of about 800 mbar (800 hPa) is used.

Obtaining the wire type geometry is also promoted, at the very beginning of the wire growth, by the simultaneous addition of silane. This silane is diluted in hydrogen at 100 ppm and a molar flow of about 400 mmol per minute is fed. The carrier gas flow is mainly nitrogen; with flows of 1000 sccm in the metal-organic line and the $NH_3$ line, a growth rate of the wires of about 130 μm per hour is obtained for diameters from 400 nm to 1 μm.

Under these conditions, the wire will grow on a sapphire substrate, previously prepared in accordance with Document [Koester10], along axis c, and with a silicon nitride layer on its side facets which are conventionally called "m plane type facets".

The silane flow can be suspended after some coverage length of the nitride layer on the wire, for example 5 μm. The wire continues to grow but it no longer includes a silicon nitride layer on its higher part.

The growth along axis c is continued whereas the m planes of the facets hardly develop anymore. Therefore, there is a very low side growth on the top.

Growth conditions are thus being selected such that some growth faces of the structure are passivated by adding the dielectric and that the crystal growth of these faces slows down or is suspended, whereas other faces keep on growing.

Details of this selectivity directly depend on material systems used, for example the In—Ga—N system, as well as experimental conditions and mechanisms involved.

Concerning this matter, Document [Chen10] will for example be referred to in the case of GaN obtained through MOCVD.

The physical thickness of the dielectric layer, as well as the equivalent dielectric thickness, given for example as silicon dioxide, are in particular defined by:
concentrations in gaseous phases or in flows,
deposition time of the dielectric layer, and
time and atmosphere for annealing this layer (for example under hydrogen or under nitrogen, or under a mixture of these gases).

Concerning this matter, the exemplary physical study given in Document [Koester10] will be referred to.

Concerning the layer annealing, it is set forth that an annealing step naturally exists because of a high temperature growth under nitrogen. And when heterostructures are grown, the layer also "undergoes" all the corresponding steps which can be considered as an annealing plus possibly material feeds.

The existence of the dielectric layer can be checked for and its nature can be determined, after the growth thereof, for example:
by SIMS (secondary ion mass spectroscopy),
by high resolution or energy loss analytical electronic microscopy,
by electrical measurements such as barrier measurements or breakdown voltage measurements, and
by X excitation or electron photoemission.

FIGS. 1A to 1H are schematic views of exemplary semi-conducting structures which have references 2a to 2h respectively and on which dielectric layers 4a to 4h have been respectively deposited in accordance with the invention.

Figure 1B:
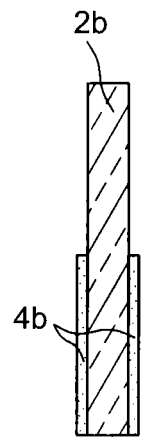
Figure 1C:
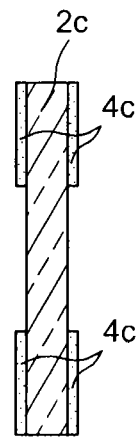

In the examples of FIGS. 1A to 1C, the structures form wires, more precisely prisms having a polygonal base, which are seen in longitudinal cross-section.

In FIG. 1B, the dielectric is deposited in a higher height than in FIG. 1A. And, in the case of FIG. 1C, the deposition of the dielectric was suspended and then resumed; this requires high length wires, higher than 5 μm for example, with growth conditions such as described above and with growth rates higher than 50 μm per hour.

This limit, beyond which the flow can be suspended, will directly depend on general growth conditions of wires. For lower $NH_3$ flows, where there are lower growth rates, much lower length for example are expected before the silane flow is suspended (see an exemplary description of this method in Document [Pederson08]).

In an alternative not represented, the structures form tubes instead of forming wires.

Figure 1D:
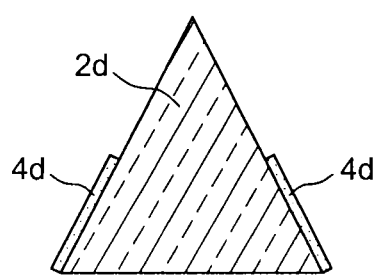
Figure 1E:
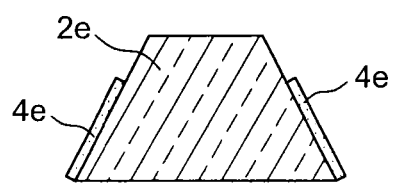

In the examples of FIGS. 1D and 1E, the structures form a pyramid in cross-section and a truncated pyramid in cross-section, respectively.

Figure 1F:
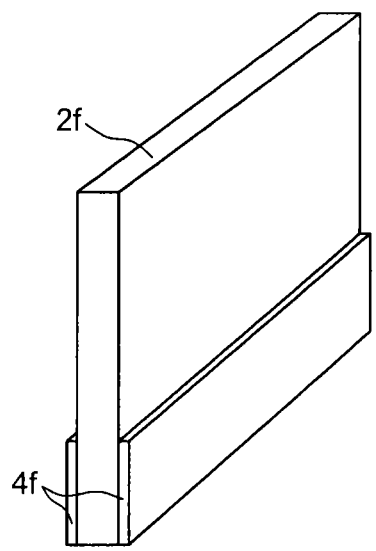
Figure 1G:
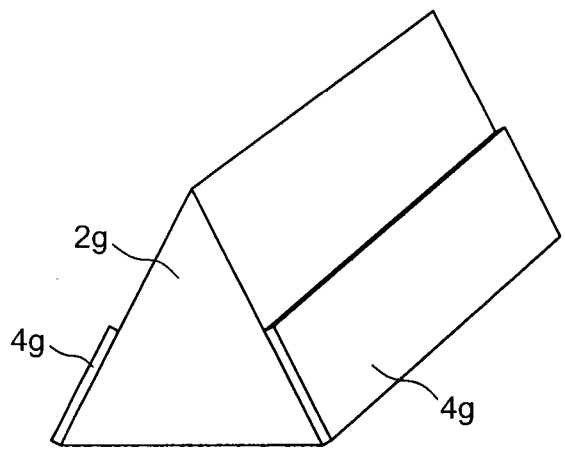
Figure 1H:
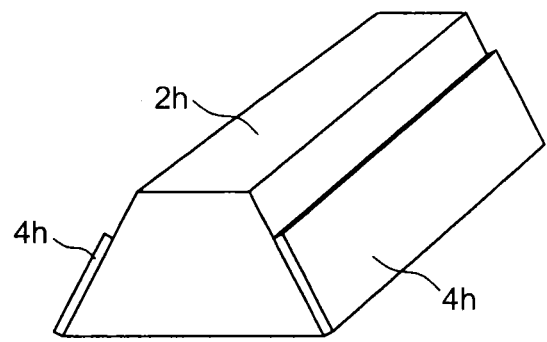

In the examples of FIGS. 1F to 1H, the structures form a prism having a rectangular base, a prism having a triangular base and a prism having a trapezoidal base, in a perspective view, respectively.

However, there can also be more complex structures, for example by using the HVPE technique, that is hydride vapour phase epitaxy. Concerning this matter, the following document will be referred to, in particular FIG. 10 thereof:

[Chelda10] O. Chelda-Gourmala et al., Complete HVPE experimental investigations: cartography of SAG GaN towards quasi-substrates or nanostructures, Journal of Crystal Growth, vol. 312, N° 12-13 (2010), pp. 1889-1907.

In the invention, a selective growth mode of the dielectric layer is used. To do this, the MOCVD technique can be used. But other techniques could be used, for example the MBE technique: by way of example, selective growth effects of GaN by using a titanium mask have been published. Concerning this matter, the following document will be referred to:

[Kishino08] K. Kishino et al., Selective-area growth of GaN nanocolumns on titanium-mask-patterned silicon (111) substrates by RF-plasma-assisted molecular-beam epitaxy, Electronics Letters, vol. 44, No. 13 (2008), pp. 819-820.

The invention can be used in the case of a semi-conducting structure which is bonded to a substrate when growing this structure (and the associated dielectric layer). This question will be discussed again upon describing FIGS. 2A and 2B.

But it can also be used in the case of a semi-conducting structure which is separated from the substrate on which it was formed and which is integrated in another device. This question will be discussed again upon describing FIGS. 4A and 4B.

A conventional example relates to nanowire based structure, for which both horizontal and vertical geometries can be assumed.

The invention is particularly interesting to provide a solution to the issue of designing electronic or optoelectronic components or sensors, to easily separate two parts of such components or such sensors.

In particular, it is usable:
to separate different structures having different dopings, for example N and P type dopings and N+- and N-type dopings, or even to separate unintentionally doped structures (which, it is true, have always a N or P type doping),
or to protect an area from an electrical or chemical medium.

The invention thus provides a solution to the problem of simplifying the manufacture of semi-conducting structures such as those represented in FIGS. 1A to 1H.

Further, the invention has the following advantages:
it is easy to be implemented, since it uses an in situ growth;
it enables technological steps which are expensive or time-consuming to be eliminated;
it is an industrial process which is perfectly integratable in conventional nanoelectronics and optoelectronics processes;
it enables a surface passivation which improves some physical properties to be created: this surface passivation results, among other things, in decreased surface states, charges and non-radiative recombination effects;
it enables semi-conducting wires to be grown;
it enables processes for manufacturing some electronic components to be simplified; and
it enables a protecting dielectric layer to be formed by virtue of which a local doping can be performed.

An exemplary method, subject of the invention, is described hereinafter, enabling layers of dielectric material to be made on first semi-conducting structures or supports, and then second semi-conducting structures on the first ones.

The supports are made of GaN wires, obtained through MOCVD, without a catalyst, as is described in Document [Koester10] which will be referred to.

However, these wires could be made by alternatives to this MOCVD technique still without a catalyst. Concerning this matter, the following document will be referred to:

[Hersee08] Hersee et al., Pulsed growth of catalyst-free growth of GaN nanowires and application in group III nitride semiconductor bulk material, US2008/0036038.

There is also another alternative which varies the flow ratios of the carrier gases $H_2$ and $N_2$. Concerning this matter, the following document will be referred to:

[Bergbauer10] W. Bergbauer et al., Continuous-flux MOVPE growth of position-controlled N-face GaN nanorods and embedded InGaN quantum wells, Nanotechnology, vol. 21, N° 30 (2010), article n° 305201.

In the example described, the method comprises three essential steps:

1. First, each supporting wire is made by feeding, into the enclosure where semi-conducting structures are made, a precursor made of silane ($SiH_4$) which promotes wire type geometry and induces N-type doping, but which also creates a very thin $SiN_x$ silicon nitride dielectric layer at the surface of the wire. Thus, this $SiN_x$ side layer spontaneously grows.

The chemical nature of this layer was measured through SIMS. Its dielectric character is determined by virtue of voltage-current measurements, up to the breakdown of the insulating barrier consisting of this dielectric layer.

2. The silane flow is then suspended. The support (wire) continues to grow; the N-type doping level decreases in the part of the wire which is formed after the silane flow is suspended.

3. At the end of the support growth, a multiquantum well InGaN/GaN is radially grown which only covers the part of the support not including $SiN_x$. Thus, the other semi-conducting structure, consisting of the multiquantum well or MQW, selectively grows on the support.

By way of purely indicating and in no way limiting purposes, the number of quantum wells of the MQW is 5.

On the other hand, it has been noticed that the formation of the nanostructures can be controlled, by the value of the second gaseous or molecular flow used in the invention (silane in the above example), and that there is a threshold for this second gaseous or molecular flow beyond which the method according to the invention is more efficient. This threshold can be ascertained the following way: for a given reactor and for given growth conditions, the value of the diameter of the nanostructures (for example the nanowires) is drawn as a function of the value of the second gaseous or molecular flow. When the flow increases, the diameter quickly decreases to be stabilized at a minimum value or to slowly increase again from a flow value which will be considered as the threshold value.

A sufficient amount of the second flow is therefore required to obtain a noticeable effect in the cross-section limitation of the nanostructures by creating the dielectric layer, for example to obtain wired structures.

By way of example for making GaN wires, a threshold of about 105 nmol/minute silane enables wires having a diameter lower than 400 nm (at a growth rate higher than 40 μm/hour), for a Ga/N ratio of about 16 and for TMG and $NH_3$ flows equal to 90 sccm and 75 sccm respectively (standard precursor flow rates) to be obtained where sccm of course means standard $cm^3$ per minute and TMG trimethylgallium.

In the above example, silane was sent into the enclosure at the same time as gaseous flows used for forming GaN wires.

However, it could be subsequently sent therein; indeed, if in low $NH_3$ flow conditions, such as described in Document [Pederson08], it is possible to grow GaN wires without using silane; adding silane can thus be made subsequently with respect to the creation of wires.

Figure 2A:
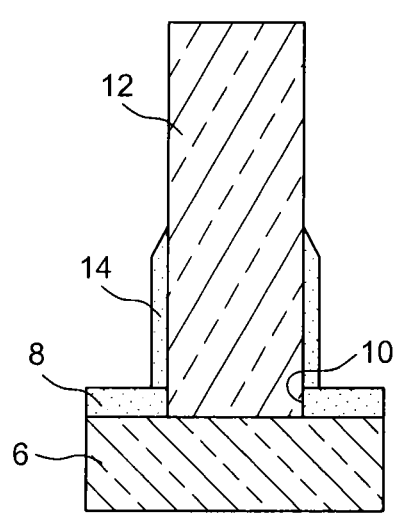
Figure 2B:
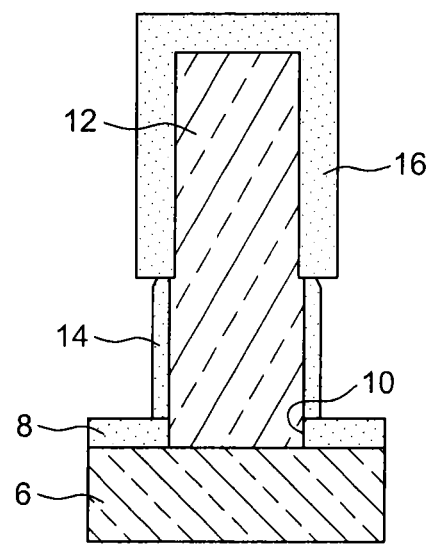

The cross-section views of FIGS. 2A and 2B schematically illustrate the example just given in paragraphs 1 to 3 above.

In FIG. 2A, a substrate 6 is seen. The latter is covered with a thin masking layer 8 of SiN, which is provided with holes such as the hole 10. The supports such as the semi-conductor 12 vertically grow at these holes.

In a non-represented alternative, no masking layer is used: the wires are grown on the substrate 6.

In the example of FIG. 2A, the masking layer 8 was formed in the same enclosure as that in which the method is implemented.

However, in an alternative not represented, this layer 8 is formed on the substrate 6 and provided with holes before introducing this substrate into the enclosure.

Returning to FIG. 2A, there can be seen the dielectric layer 14 of $SiN_x$ which selectively grows on the vertical layer 12: this layer 14 covers a lower part of the wire 12 from the substrate.

It should be noted that this wire could be heterogeneous, for example as regards doping or concentration along its growth axis.

The growth of the dielectric layer 14 can be suspended after some time such that this layer only partially covers the support, as can be seen in FIG. 2A.

FIG. 2B shows the selective growth of a layer or a multilayer 16, that is a multiquantum well in the example considered above, on the part of the wire 12 which is not covered with the dielectric layer 14.

This layer or multilayer 16 can have the same nature as the substrate 6. However, in some cases, it must have a doping different from the substrate doping, for example when N/P diode having a nature other than the wire 12, or even an heterostructure is desired to be made.

By way of example, the substrate is of GaN (for example, N-doped) (but it could also be, for example, of AlN, of Si (for example N- or P-doped) with a possible intermediate AlN layer, of ZnO (for example, N-doped) or of sapphire); the wire is of N– or N+-doped GaN; the layer 14 is of $Si_3N_4$ and a layer 16 of InGaN is formed; or rather than this layer 16, an InGaN/GaN multilayer is formed; and then a P-doped GaN layer is formed on this layer or this multilayer; a light emitting diode structure is thus obtained.

It should be noted that the case where there are no selective growth, that is when the layer or multilayer 16 covers the dielectric layer 14 or even the masking layer 8, is also interesting. Indeed, an electrical decoupling is then preserved between the substrate 6 and this layer or multilayer 16.

By way of purely indicative and in no way limiting purposes, an exemplary method, subject of the invention, is given hereinafter enabling a structure of the kind represented in FIG. 2B to be obtained:

A shower type 3×2" MOCVD rack, marketed by AIX-TRON is used, with the precursors trimethylgallium (TMG) at 0° C. and ammonia for Ga and N feeds. In this exemplary application, a self-organized growth method of the wires on the sapphire substrate 6, having the orientation c, is used, as described in further details in Document [Koester10]. The following successive steps are used:

the sapphire substrate is annealed under $H_2$ at 1040° C. during 20 minutes, and nitrided with $NH_3$ with a flow of 2000 sccm for 30 s. This results in washing the surface, smoothing it and forming a very thin surface layer of AlN which improves the epitaxy quality, in particular in terms of control of the polarity of the support 12 (see Document [Chen10]);

the layer 8, on the substrate 6, is directly formed in the reactor. To do this, silane $SiH_4$ (45 sccm diluted to 100 ppm in $H_2$) and $NH_3$ (4000 sccm) are simultaneously injected. Finally, the layer 8 consists of a layer of about 1.5 nm of AlN and 2 nm of silicon nitride as determined by X-ray reflectivity;

nucleation sites of the support 12 are determined by a nucleation step of 10 s at 1000° C. during which 135 μmol per minute of TMG and 2.232 mmol per minute of $NH_3$ are injected in a carrier gas consisting of nitrogen, with a flow rate of 8000 sccm. The nucleates of the support 12 are thus formed; they are epitaxied on the substrate 6;

the growth of the support 12 starts up by using TMG and $NH_3$ together, with a molar flow ratio equal to 15 at about 1000° C. The molar flows are about 60 sccm for TMG and 50 sccm for $NH_3$ and a pressure of about 800 mbar (800 hPa) is used.

The simultaneous addition of silane enables the wire-type geometry to be promoted but it also enables the nitride layer 14 to be grown. This silane is diluted in hydrogen at 100 ppm and a molar flow of about 400 nmol per minute of silane is fed. The carrier gas flow is mainly nitrogen. For flows of 1000 sccm in the metal-organic line and the $NH_3$ line, a growth rate of the wires of about 130 μm per hour is obtained for diameters from 400 nm to 1 μm;

after a growth of 3 minutes (wire size of about 7.5 μm), the $SiH_4$ flow is suspended and the growth of the support 12 is continued. A time of about 6 further minutes can lead to a wire length of about 22.5 μm, with 15 μm for the support 12 which are not covered with the layer 14;

the growth of the layer 16 is then performed, that is five InGaN/GaN quantum wells in the example. This growth simply occurs on the part of the support 12 which has not the dielectric layer 14. An InGaN quantum well, having the thickness 1 nm (growth time of about 20 s) is deposited at 730° C. under a flow of carrier gas $N_2$ by using TMG, ammonia and the precursor trimethylindium (TMI).

The temperature is quickly increased to 840° C. to grow a GaN barrier of about 10 nm by using a triethylgallium (TEG) precursor. The last GaN barrier can be N or P-doped depending on the device requirements. Electron blocking layers of AlGaN can also be added to improve the electrical characteristics, like in the conventional two-dimension LED structures.

By way of example, by a method in accordance with the invention, GaN wires were grown in the presence of a silane flow for 300 seconds. Wires having a same height H, equal to 7.5 μm were thus obtained, covered with a layer of dielectric material, silicon nitride.

Figure 3:
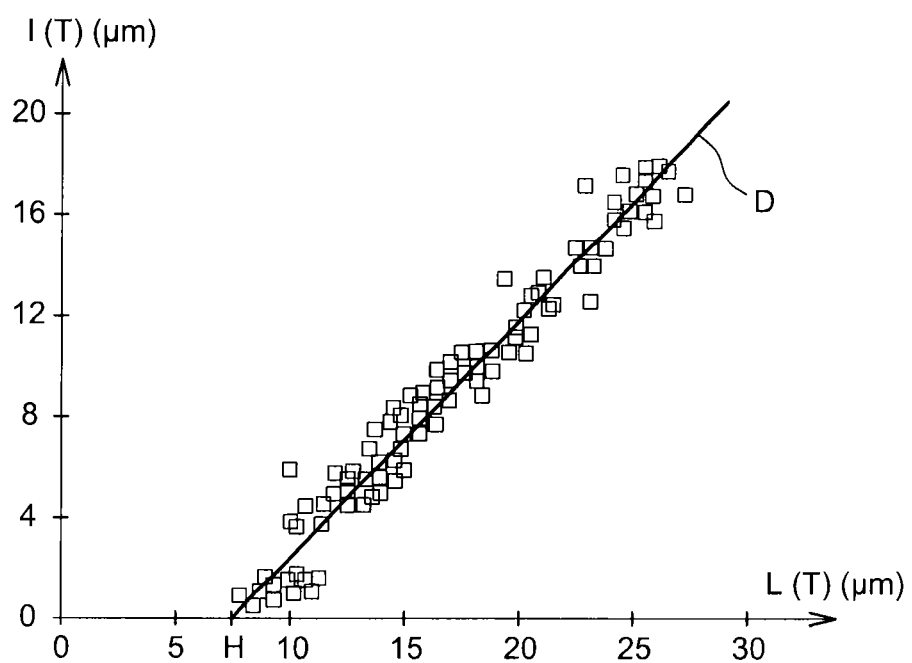
FIG. 3 shows variations in the length of a coating of multiquantum wells, formed on a semi-conducting wire, as a function of the wire length.

It is set forth that this height can be easily varied by changing the growth time or growth rate, for example by modifying flow rates of the carrier gases. The growth rate is variable. In the case of FIG. 3, it was 90 μm per hour because the flows of carrier gas were 0.5 μm liter per minute in both metal-organic and hydride lines.

Then, silane flow was suspended and the growth of wires was allowed to continue for a variable time T, ranging from 0 to 800 seconds, resulting in a variable total length L(T) for the wires. And then, multiquantum wells were grown on a length l(T) of the area of the wires which is not covered by silicon nitride.

The variations of l(T) as a function of L(T) are represented in FIG. 3.

It is noticed that the points obtained are substantially distributed along a straight line D. This latter intercepts the abscissa axis at H.

This confirms that the multiquantum wells do not form on silicon nitride.

Figure 4A:
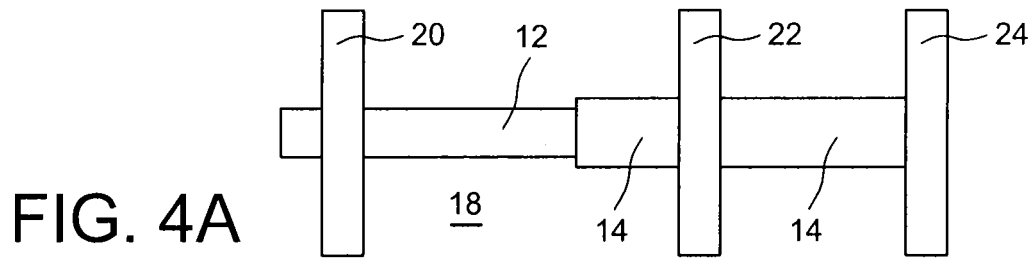
FIGS. 4A and 4B are schematic top views of structures which are obtained by a method in accordance with the invention and resulting from the structures represented in FIGS. 2A and 2B, respectively.
Figure 4B:
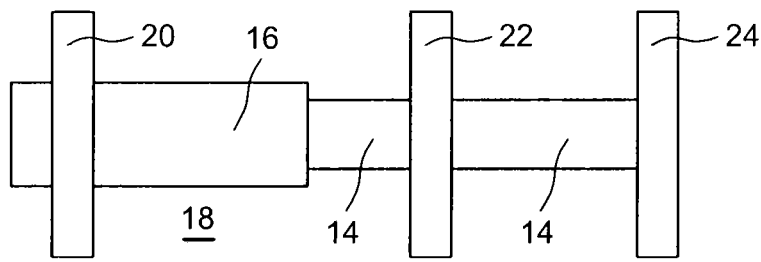

FIGS. 4A and 4B are schematic top views of structures obtained by a method in accordance with the invention and respectively result from the structures represented in FIGS. 2A and 2B.

In a known manner per se, wires, of the kind of those represented in FIGS. 2A and 2B, can be detached from their substrate by scrapping the same or by exposing to ultrasounds the wire-substrate assembly soaked in an ethanol solution; and these wires can then be laid onto another substrate.

Such a treatment is then applied to the vertical wire 12-dielectric 14 assembly (respectively wire 12-dielectric 14-layer or multilayer 16) seen in FIG. 2A (respectively 2B) to detach it from its substrate 6; and then it is deposited onto another substrate 18 which is for example electrical insulating. The structure which is represented in FIG. 4A (respectively 4B) and which is horizontally lying on the substrate 8 is obtained.

Then, three metal or ohmic contacts 20, 22, 24 can be formed, for example deposited, onto the structure, as can be seen in FIGS. 4A and 4B.

In the example represented in FIG. 4A (respectively 4B), the contacts 22 and 24 are formed onto the dielectric layer 14 and the contact 20 is formed on the part of the wire 12 which does not contain any dielectric (respectively on the layer or multilayer 16).

It should be noted that the contact 24 can be directly formed onto the semi-conducting wire 12 if the dielectric 14 is removed or locally destroyed before forming the contact 24. This contact 24 can be used as a source in a nanoelectronic device; whereas the contact 20 can be used as a drain and the contact 22 as a gate.

Figure 5:
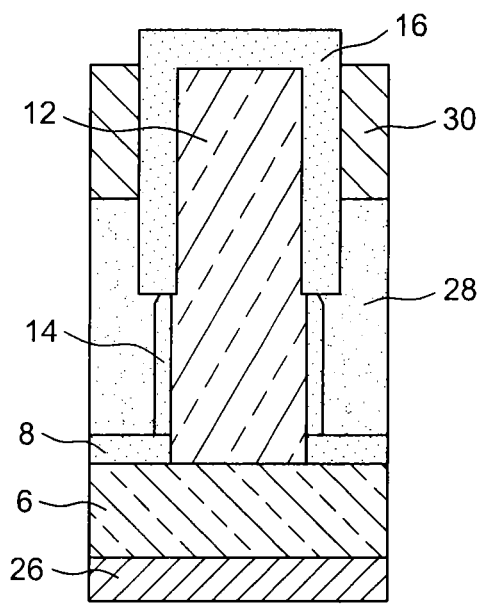
FIG. 5 is a schematic cross-section view of a device obtained in accordance with the invention, and FIG. 6 schematically illustrates an alternative of the device of FIG. 5.

FIG. 5 is a schematic cross-section view of a device which has been obtained in accordance with the invention. This device comprises a multilayer which consists of a heterostructure and was added to the semi-conducting wire as has already been explained above.

This device is identical to the structure which has been described in reference to FIG. 2B, with the difference that there are further formed:
- a metal layer 26, making a first contact on the face of the substrate 6, which face is opposite to that which carries the layer 8,
- an electrically insulating layer 28 on this layer 8, and
- another metal layer 30 forming a second contact on the layer 28.

More precisely, the layer 28 extends up to some level of the multilayer 16 (heterostructure), and the layer 30 extends on a peripheral portion of the latter, as can be seen. And, in this example, the substrate 6 is electrically conducting or semi-conducting.

FIG. 5 illustrates the value of the method, subject of the invention, to solve aligning tolerance problems.

Indeed, in the device represented in this FIG. 5, the insulating layer 28 can be a resist layer having drawbacks: its thickness is not necessarily adjusted to the respective heights of the layer 14 and the multilayer 16; therefore, if the dielectric layer 14 was not present anymore, the layer 30 would risk to be in contact with the support consisting of the semi-conducting wire 12.

Depending on the very nature of the heterostructure, the device represented in FIG. 5 can correspond to a light emitting diode or a photodetecting diode. Its manufacture only requires a small number of technological steps because of the spontaneous growth of the dielectric layer 14.

About FIG. 5, it is set forth that the layer 30 is represented therein as being planar and not covering the multilayer 16.

But, generally, every case is possible (and observable) and there can be an entire coverage of the multilayer 16 by the layer 30 or, conversely, a merely conformal deposition (and having a nearly constant thickness) around the multilayer 16.

The layer 30 can also be conformal, on top of the multilayer 16.

Figure 6:
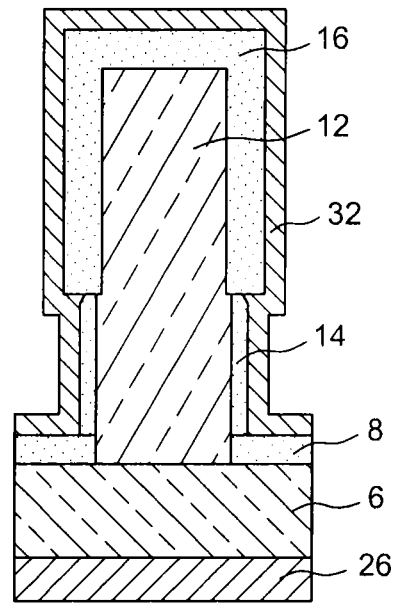

This is schematically illustrated by FIG. 6. There can be seen the structure of FIG. 2B wherein a further layer 32 was deposited in a standard way. This layer 32 is used as an electrode to make for example a light emitting diode and it is made on a electrically conducting transparent material, for example TCO (transparent conducting oxide) such as ITO (tin-doped indium oxide). It can also be seen that the structure of FIG. 6 comprises the metal layer 26 on the substrate 6, as is the case of FIG. 5.

The layer 32 entirely and conformally covers the structure, in particular the layers 16 and 14. More precisely, the coverage of the layer 16 (multilayer) enables injection of electrical charges to be improved; and by virtue of the presence of the insulating layer 14, the layer 32 can go down to the substrate which is insulated by the masking layer 8. Any coupling of light, emitted by the multilayer 16, by side flanks of the latter is thus prevented and hence, the overall extraction of the overall device is improved.

Further, it is set forth that the metal contact corresponding to the layer 26 can also be made on the same side of the substrate 6 as the structure formed on the same, by adding lithography-etching steps to ensure continuity between metal and the substrate 6. Further, the substrate 6 can possibly consists of an insulator (for example sapphire) covered with GaN with at least one very doped layer contacting the wire 12.

In the examples given above, the supports 12 (semi-conducting wires) are of GaN. But the invention is not restricted to GaN: the examples can be adapted to form supports made of a semi-conductor preferably selected from semi-conducting nitrides and compound semi-conductors III-V, IV-IV and II-VI.

Furthermore, in the examples given above, the dielectric layer 14, which is formed on the supports 12, is of silicon nitride. But the invention is not restricted to this material: the examples can be adapted to form dielectric layers made of another dielectric preferably selected from silica, alumina and hafnium oxide.

This other dielectric can also be selected from gallium oxides and gallium oxynitrides. This results in simply introducing oxygen into the enclosure where the method is implemented.

Furthermore, in the examples given above, the dielectric layer is formed on a wire-shaped structure, more exactly in the shape of a prism with polygonal base. But the invention is not restricted to such a shape: the examples can be adapted to obtained structures forming prisms having rectangular, triangular or trapezoidal bases, or structures forming pyramids, truncated pyramids or even tubes.

Furthermore, in the examples of the invention, the growth of the dielectric layer has been suspended. But the invention is not restricted to this: this growth could be resumed after the suspension, by sending again the appropriate flow(s) into the enclosure where the structures are formed.

Further, in the examples of the invention, the MOCVD technique is used. But the invention can also be implemented by using the MBE technique or the HVPE technique.

The invention claimed is:

1. A method of selective growth without catalyst on a first semi-conducting structure, comprising:
   forming the first semi-conducting structure on a substrate, from first gaseous or molecular flows;

at a same time to the first gaseous or molecular flows, adding at least one second gaseous or molecular flow, capable of selectively in situ growing a dielectric layer on the first semi-conducting structure; and on the first semi-conducting structure thus provided with the dielectric layer, growing a second semi-conducting structure from third gaseous or molecular flows.

2. The method according to claim 1, wherein growth conditions of the dielectric layer are selected such that the dielectric layer selectively forms on the first semi-conducting structure.

3. The method according to claim 1, wherein the growing the dielectric layer is suspended, and then resumed.

4. The method according to claim 1, wherein the first gaseous or molecular flows are selected such that the first semi-conducting structure comprises at least one semi-conductor selected from the group comprising semi-conducting nitrides and compound semi-conductors III-V, IV-IV and II-VI.

5. The method according to claim 1, wherein the second gaseous or molecular flows is selected such that the dielectric layer is made of a material selected from silicon nitride, silica, alumina, hafnium oxide, gallium oxides, and gallium oxynitrides.

6. The method according to claim 1, wherein the first semi-conducting structure has a shape of a solid selected from prisms with polygonal, rectangular, triangular or trapezoidal bases, pyramids, truncated pyramids, and tubes.

7. The method according to claim 1, wherein the first semi-conducting structure, the dielectric layer, and the second semi-conducting structure are formed by a technique selected from metal-organic chemical vapor deposition, molecular beam epitaxy, and hydride vapor phase epitaxy.

8. A method of selective growth without catalyst on a first semi-conducting structure, comprising:

forming the first semi-conducting structure on a substrate, from first gaseous or molecular flows;

at a same time or subsequently to the first gaseous or molecular flows, adding at least one second gaseous or molecular flow, capable of selectively in situ growing a dielectric layer on the first semi-conducting structure; and on the first semi-conducting structure thus provided with the dielectric layer, growing a second semi-conducting structure from third gaseous or molecular flows, wherein the dielectric layer is selected such that the second semi-conducting structure is formed on the first semi-conducting structure but not on the dielectric layer.

9. The method according to claim 8, wherein the growing the dielectric layer is suspended, and then resumed.

10. The method according to claim 8, wherein the first gaseous or molecular flows are selected such that the first semi-conducting structure comprises at least one semi-conductor selected from the group comprising semi-conducting nitrides and compound semi-conductors III-V, IV-IV and II-VI.

11. The method according to claim 8, wherein the second gaseous or molecular flows is selected such that the dielectric layer is made of a material selected from silicon nitride, silica, alumina, hafnium oxide, gallium oxides, and gallium oxynitrides.

12. The method according to claim 8, wherein the first semi-conducting structure has a shape of a solid selected from prisms with polygonal, rectangular, triangular or trapezoidal bases, pyramids, truncated pyramids, and tubes.

13. The method according to claim 8, wherein the first semi-conducting structure, the dielectric layer, and the second semi-conducting structure are formed by a technique selected from metal-organic chemical vapor deposition, molecular beam epitaxy, and hydride vapor phase epitaxy.

14. A method of selective growth without catalyst on a first semi-conducting structure, comprising:

forming the first semi-conducting structure on a substrate, from first gaseous or molecular flows;

at a same time or subsequently to the first gaseous or molecular flows, adding at least one second gaseous or molecular flow, capable of selectively in situ growing a dielectric layer on the first semi-conducting structure; and on the first semi-conducting structure thus provided with the dielectric layer, growing a second semi-conducting structure from third gaseous or molecular flows, wherein the first semi-conducting structure is a wire that vertically extends from the substrate, the dielectric layer is grown such that it covers a lower part of the wire from the substrate, and the second semi-conducting structure is only grown on an upper part of the wire, which is not covered by the dielectric layer.

15. The method according to claim 14, wherein an electrically conducting or semi-conducting substrate is used, the first and second semi-conducting structures are formed to make a diode, and further a first electrically conducting contact is formed on the substrate and a second electrically conducting contact is formed on the second semi-conducting structure.

16. The method according to claim 14, wherein an electrically conducting or semi-conducting substrate is used, the first and second semi-conducting structures are formed to make a diode, and further a first electrically conducting contact is formed on the substrate and a layer of electrically conducting transparent material which conformably covers the dielectric layer and the second semi-conducting structure is formed.

17. The method according to claim 14, wherein the wire is separated from the substrate after the second semi-conducting structure has been formed, and then the wire is placed on another substrate such that the wire horizontally extends on the other substrate.

18. The method according to claim 17, wherein ohmic or electrically conducting contacts are further formed on the wire, at the dielectric layer and the second semi-conducting structure.

* * * * *